United States Patent [19]

Wellington

[11] 4,296,993
[45] Oct. 27, 1981

[54] ELECTRICAL CONTACT WITH IMPROVED MEANS FOR SOLDER WICKING AND DEGASSING

[75] Inventor: Roger D. Wellington, Cumberland, R.I.

[73] Assignee: Augat Inc., Attleboro, Mass.

[21] Appl. No.: 109,850

[22] Filed: Jan. 7, 1980

Related U.S. Application Data

[63] Continuation of Ser. No. 936,485, Aug. 24, 1978, Pat. No. 4,236,776.

[51] Int. Cl.³ .............................................. H01R 9/06
[52] U.S. Cl. ................................................. 339/275 B
[58] Field of Search ............. 339/17 R, 17 C, 17 CF, 339/220, 275 R, 275 B, 276 A

[56] References Cited

U.S. PATENT DOCUMENTS

| | | | |
|---|---|---|---|
| 2,990,533 | 6/1961 | Hughes et al. | 339/220 R |
| 3,103,547 | 9/1963 | Ansley | 339/275 B |
| 3,202,755 | 8/1965 | Oswald | 339/17 R |
| 3,781,770 | 12/1973 | Mancini | 339/17 R |

*Primary Examiner*—Joseph H. McGlynn
*Attorney, Agent, or Firm*—Weingarten, Schurgin & Gagnebin

[57] ABSTRACT

An electrical contact adapted to be mounted in a plated-through hole and having means to improve solder wicking and degassing. A conical transitional surface between the bottom of the contact body and the solder tail is provided with a plurality of projecting ribs. When inserted in a plated-through hole, because the body is larger than the hole, the ribs rest on the rim of the hole and provide degassing paths between them. The contact may be mounted individually in electrical panel boards, or in arrays in insulators wherein the contacts receive the leads of dual-in-line packages or other electronic components.

6 Claims, 7 Drawing Figures

ELECTRICAL CONTACT WITH IMPROVED MEANS FOR SOLDER WICKING AND DEGASSING

This is a continuation, of application Ser. No. 936,485 filed Aug. 24, 1978, now U.S. Pat. No. 4,236,776.

FIELD OF THE INVENTION

This invention relates generally to the field of electronic interconnection devices and more particularly concerns an improved electrical contact adapted to be soldered to an electronic interconnection panel board to provide pluggable mounting of electronic component leads.

DISCUSSION OF THE PRIOR ART

Socket contacts to provide pluggability for the leads of electronic components have been employed in the electronic interconnection industry for some time and in various configurations. Some such contacts are intended to be force-fitted directly into holes bored in panel and printed circuit boards. Other contacts are intended to be directly inserted into plated-through holes in similar panel or printed circuit boards. The considerations involved with each type of mounting are normally somewhat different. Additionally, socket contacts of the general type herein under consideration, that is, a two-piece structure having an external cylindrical sleeve or body coupled with a frictionally engaging insert fitted in the open socket end, and a wire wrapping pin or solder tail projecting from the opposite end, may be mounted with the main part of the body within the hole in the board, or with only the solder tail in the hole and the body extending upwardly from the board surface. These are known as the low and high mounting positions respectively. Another alternative is to mount such a socket contact in an insulative socket, normally configured in a dual-in-line array, so that the solder tails may be inserted into and soldered witin plated-through holes in a panel board. A dual-in-line package (DIP) may then be pluggably mounted to the insulator as desired with the leads being frictionally received by the socket contacts. Other configurations for such insulators may be structured to receive the leads of other types of electronic components.

One problem with many of the prior art socket contacts is that when they are inserted into a plated-through hole in a panel board in the high position, the transitional surface between the cylindrical body and the solder tail or wire wrapping pin rests directly on the rim of the hole plating, thereby sealing off the top of the hole. When solder is applied to the other end of the hole from which the solder tail projects, typically during wave soldering, the fact that the top of the hole is essentially sealed off by the socket contact prevents the gas generated during the soldering process from escaping from the top of the hole. Appropriate wicking of the solder up through the entire hole to provide a solid electrical and physical connection between the solder contact and the plated-through hole is also prevented because the top of the hole is closed and gas does not easily escape. One attempt to solve this problem has been to provide stand-offs integrally formed with the insulator to which the socket contacts are mounted so that when the stand-offs rest on top of the panel board surface, the conical transition from the soler contact body to the projecting solder tail is slightly above the rim of the plated-through hole. This has not been totally satisfactory, one reason being that there are several tolerances involved. One is the tolerance of the stand-off itself; another is the tolerance of insulator as it receives the socket contact in a hole therein; and a third is the relative length of several socket contact portions with respect to other portions. All of these tolerances may be cumulative so that the overall height of the top of the insulator above the board is greater than necessary, or the tolerances may be such that the bottom of the cylindrical body still blocks the top of the plated-through hole. Another reason for stand-offs being less than totally satisfactory is that their addition lends an element of complication to the insulator mold, the insulator normally being made of plastic. Furthermore, when the socket contact is mounted directly to plated-through holes without being mounted in an insulator, there is no means to maintain it in a position whereby the top of the plated-through hole is not closed off.

SUMMARY OF THE INVENTION

Broadly speaking, this invention relates to an improved electrical contact, which may be of the two-piece type, having a projecting solder tail or wire wrapping pin wherein a means integral with the contact provides for degassing during soldering and enhances solder wicking to thereby improve the physical and electrical connection between the contact and the plated-through hole of the panel board.

A particular socket contact of this invention is a two-piece device formed of a hollow, generally cylindrical sleeve body having a tapered opening in one end and a wire wrapping pin or solder tail projecting from the other end. The transition between the cylindrical body portion and the solder tail is normally a conical surface. An insert having a tapered opening and converging flexible fingers adapted to frictionally engage the lead of an electronic component is inserted into the open end of the sleeve to provide pluggability of component leads. Pluggability in this field of electronic interconnection means that leads are frictionally engaged and are easily removed and reinserted. The conical transitional surface is formed with a plurality of ribs projecting outwardly and substantially parallel to the conical surface. These ribs are spaced from one another and, because the sleeve is larger than the hole in the board, are adapted to make contact with the rim of a plated-through hole to provide a degassing path between them. This permits gases generated during the soldering process to flow outwardly through the top of the hole between the plating material and the contact and at the same time facilitates wicking of the solder throughout the length of the hole to provide the desired physical and electrical connection between the contact and the panel board. Other devices having similar purposes may be formed differently, and not be of the typical two-piece construction.

The socket contact of this invention, through its own integral structure, facilitates degassing and solder wicking. In contrast with the known prior art, there is no need for external apparatus to hold the socket contact above the plated-through hole. When there are several such contacts mounted in an insulator, tolerances are not as critical since the ribbed transitional surfaces of the socket contacts which first engage the rims of the holes in the board hold the other socket contacts slightly above the board, free of the other holes.

BRIEF DESCRIPTION OF THE DRAWING

The advantages, features and objects of the invention will be readily appreciated from the following detailed description when read in conjunction with the accompanying drawing in which.

DESCRIPTION OF THE PREFERRED EMBODIMENTS

Figure 1:
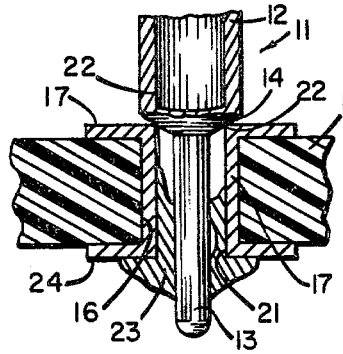
FIG. 1 is an enlarged sectional view showing the prior art device in a plated-through hole after soldering.

A socket contact mounted in a plated-through hole in accordance with the prior art is shown in FIG. 1. Contact 11 is a known device having a cylindrical body 12 connected to a solder tail 13 by means of a conical transitional surface 14. A conventional insulative printed circuit or panel board 15 is formed with a hole 16 lined with plating material 17 forming a somewhat smaller hole 21. The materials of the panel board and the plating material are well known in the art and will not be discussed in detail herein. The socket contact is inserted in the plated-through hole whereby conical surface 14 encounters the top rim 22 of hole 21 with solder tail 13 projecting through and somewhat beyond the bottom rim of the hole. Solder 23, typically applied by means of a wave soldering process, is shown partially within hole 21 and extending from the distal end of solder tail 13 laterally outwardly in contact with pad 24 of the plating material. Note that there are unsoldered areas within the length of the hole and that the solder has only partly filled the hole due to incomplete wicking partially caused by gas entrapment between the solder applied at the bottom of the hole and the top of the hole which is sealed by means of conical surface 14 contacting rim 22. The resulting electrical and physical connection between socket contact 11 and plated-through hole is unsatisfactory and would not satisfy the relatively stringent requirements for such devices in many applications.

Figure 2:
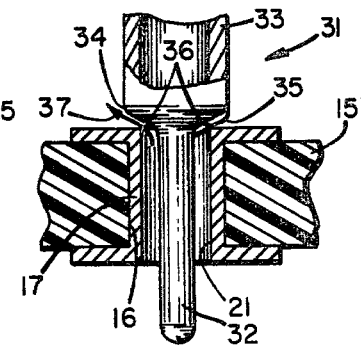
FIG. 2 is a similar view of the contact of the present invention prior to soldering.
Figure 3:
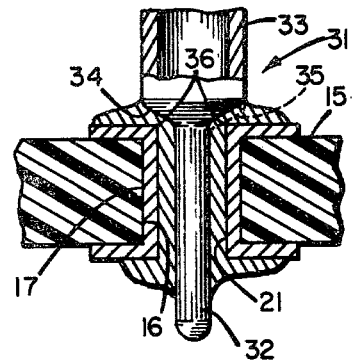
FIG. 3 is a view similar to FIG. 2 after the soldering step.
Figure 4:
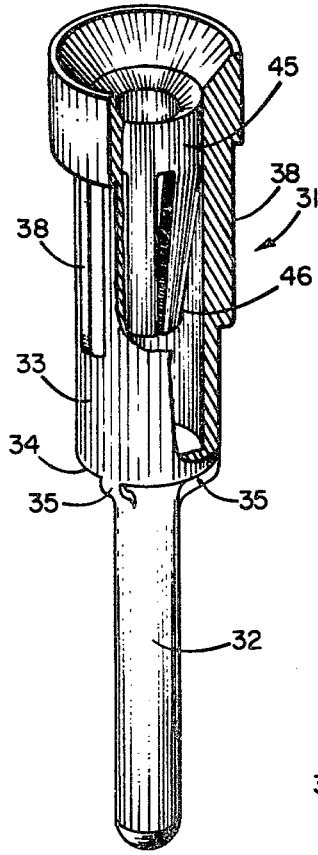
FIG. 4 is a perspective, partially cut away view of the contact of FIG. 2.
Figure 5:
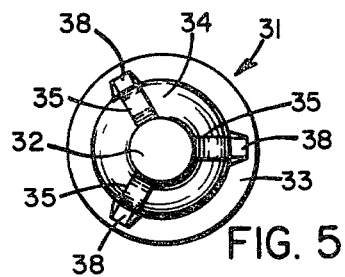
FIG. 5 is a bottom view of the contact of FIG. 4.

With reference now to FIGS. 2, 3 and 4, there is shown socket contact 31 as a preferred embodiment of the present invention having solder tail 32 projecting from cylindrical sleeve or body 33 and interconnected therewith by means of conical transitional surface 34. Projecting outwardly from and generally parallel to surface 34 are a plurality or ribs 35. As in FIG. 1, insulative panel board 15 is formed with a hole 16 lined with plating material 17 to form plated-through hole 21. When socket contact 31, with the diameter of body 33 being larger than hole 21, is inserted into the plated-through hole, ribs 35 make contact with rim 36 of the plating thereby providing a path for gas escapes between the ribs as indicated by arrow 37 in FIG. 2.

Because of the opening which remains between the top rim 36 of the plated-through hole and the bottom surface 34 of the socket contact, when the board with the contact inserted in the plated-through hole is wave soldered, the solder completely fills the space between solder tail 32 and the hole plating, as it is clearly shown in FIG. 3. With this complete and even distribution of solder, a very positive physical and electrical connection between plating 17 and the socket contact is achieved. There are substantially no unsoldered areas due to gas entrapment because the gas can easily escape between conical surface 34 and the top rim 36 of the plated-through hole. A connection made with the solder contact of the present invention would easily satisfy even the most stringent requirements in the industry.

Figure 6:
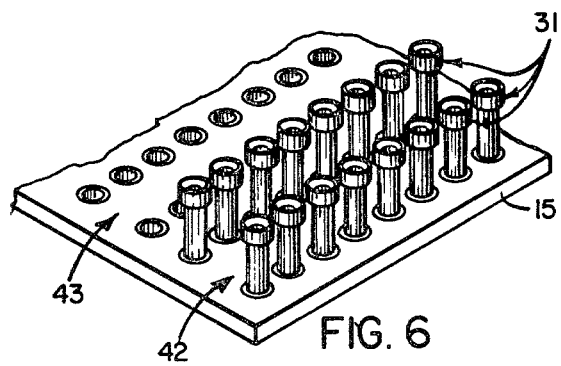
FIG. 6 is a fragmentary view of a panel board showing the contacts of the present invention mounted individually in a dual-in-line array of holes in the board.

An example of the manner in which the socket contacts of the present invention may be mounted individually to a panel board in a dual-in-line array of holes 42 is shown in FIG. 6. The contacts are mounted in the high position, that is, with the solder tail extending through the plated-through hole and the body of the socket contact remaining above one side of the panel board, a configuration which results from the mounting position shown in FIG. 2.

Alternatively, the socket contacts of the present invention could be inserted directly in unplated holes in the normally relatively fibrous insulating material of a printed circuit board so that the body of the socket contact is within the hole in the board. This is a normal mounting configuration for socket contacts having wire wrapping pins extending therefrom instead of solder tails. For this purpose, ribs 38 are provided along the surface of cylindrical body 33 which form an interference fit with an unplated hole in a panel board.

Figure 7:
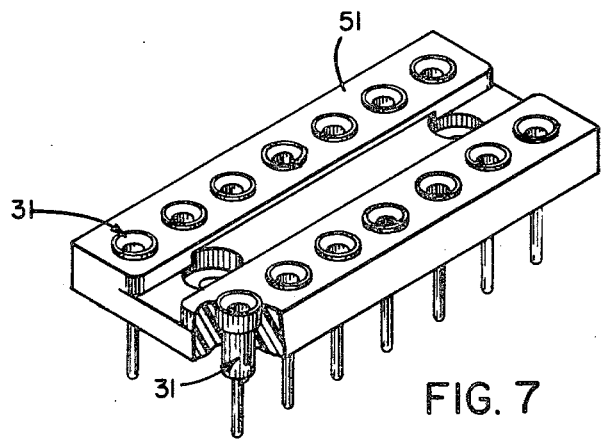
FIG. 7 is a perspective view of a dual-in-line insulator having a plurality of contacts of the present invention mounted therein.

Another alternative means for mounting the socket contacts of the present invention is shown in FIG. 7. Insulative socket 51 is formed with a plurality of holes in a dual-in-line configuration, and a socket contact 31 of the present invention is mounted, preferably by means of a force fit, in each of the holes. The barrel of the socket contact projects a short distance from the bottom of the insulator and the solder tail projects therebeyond. When the insulator is mounted to a panel board having a plurality of dual-in-line arrays 43 of plated-through holes therein, the solder tail extends through the hole in a manner shown in FIGS. 2 and 3 and soldering may be accomplished as previously indicated. Thus, the dual-in-line configuration of a plurality of socket contacts is permanently fixed to a panel board and a DIP or integrated circuit may be pluggably inserted into the socket contacts mounted to the insulator.

The configuration of socket contact 31 shown in FIG. 4, having longitudinal ribs 38, may be used to advantage for anchoring the contacts in the holes in insulator 51. Alternatively, the external surface of body 33 may be formed with several (for example, four) flats reducing somewhat the diameter of the socket contact body. Such configuration has the advantage of facilitating rotational orientation of the sleeve when mounting insert 45 therein, so that the composite socket contact may be rotationally oriented when mounted to insulator 51. This facilitates enhanced contacts of a flat component lead by fingers 46 of the insert, ensuring surface-to-surface contact where possible. Additionally, because it is desirable to use the smallest possible insulator 51 to reduce use of material and to allow increased component density on the board, the longitudinal edges are made as thin as possible beyond the holes in which socket contacts 31 are mounted. The ribs 38 of contacts 31 could break through sides with relatively thin walls where there is an interference fit between the socket contact and the hole in the insulator. The use of angularly spaced flat longitudinal sides of body 33 allows the outside edge walls of insulator 51 to be relatively thin without the likelihood of rupture of the insulator, while ensuring secure mounting of the socket contacts in the insulator holes.

Although the preferred embodiment of the invention includes a solder tail as shown in the drawing, it could alternatively be formed with wire wrapping pins. The form and purpose of the elongated pin is not critical to the invention. What is important is that the contact has integrally formed means to facilitate degassing and forming an improved solder joint between the contact and a plated-through hole. Further, the internal configuration of the contact is of no importance to the invention, it need only be a means for coupling an electronic component lead to the panel board without any requirement for having a two-piece construction.

While transitional surface 34 is shown to be conical, such configuration is not a requirement. A conical surface is often easier to manufacture but for purposes of the invention, it is only necessary that there be intermittent or spaced projections which contact the top of the plate-through hole to prevent the hole from being sealed by the body of the contact.

For reference purposes, examples of the dimensions of the present invention will be provided. However, it should be noted that neither size nor materials employed are pertinent to the present invention. A socket contact of the present invention is typically 0.29 inch (7.37 mm) long, having a body length of 0.15 inch (3.8 mm), the solder tail being 0.125 inch (3.17 mm) long, and the transitional conical surface having a length of 0.015 inch (0.38 mm). The overall diameter at the top rim of the body is 0.067 inch (1.7 mm), the body having a nominal diameter of 0.052 inch (1.33 mm), the solder tail being 0.0236 inch (0.6 mm) in diameter. The bore within sleeve 33 has a diameter of 0.044 inch (1.12 mm), and the included angle of the taper at the top opening of the sleeve is typically 100°. The rib 35 projects from transitional surface 34 approximately 0.0039 inch (0.1 mm). The material from which the socket contact is made is normally copper for ease of manufacture, which is plated with a material to which solder easily adheres.

In view of the above description, it is likely that others skilled in the art will device modifications and improvements which are within the scope of this invention.

What is claimed is:

1. A contact adapted to be soldered in a cylindrical plated-through hole in an interconnection board so as to facilitate solder wicking and degassing when so soldered, said contact comprising:
   a cylindrical body, larger in diameter than said plated-through hole;
   an elongated pin axially projecting from one end of and being substantially smaller in cross section than said cylindrical body;
   a conical transitional surface connecting said cylindrical body and said pin; and
   a plurality of ribs substantially parallel to and projecting outwardly from said transitional surface;
   whereby when said contact is mounted in said plated-through hole with said pin projecting thereinto, said ribs make surface contact with the rim of said plated-through hole thereby spacing said transitional surface from said rim and providing escape paths for gases between said ribs and between said transitional surface and said rim.

2. The contact recited in claim 1 wherein said ribs project about 0.1 millimeter from said surface.

3. The contact recited in either of claims 1 or 2 wherein there are three said ribs angularly spaced by about 120° on said surface.

4. The contact recited in either of claims 1 or 2 wherein there are at least three said ribs substantially equiangularly spaced around said surface.

5. The contact recited in claim 1 wherein said elongated pin is a round solder tail.

6. The contact recited in claim 1 wherein said contact is a two-piece socket contact having an insert with converging fingers to frictionally engage a lead of an electronic component.

* * * * *

UNITED STATES PATENT AND TRADEMARK OFFICE
CERTIFICATE OF CORRECTION

PATENT NO. : 4,296,993
DATED : October 27, 1981
INVENTOR(S) : Roger D. Wellington It is certified that error appears in the above—identified patent and that said Letters Patent is hereby corrected as shown below:

| | | |
|---|---|---|
| Column 1, | line 6, | "continuation, of" should read --continuation of--; |
| | line 40, | "witin" should read --within--; |
| | line 67, | "soler" should read --solder--. |
| Column 3, | line 65, | "escapes" should read --escape-. |
| Column 5, | line 25, | "plate-through" should read -plated-through--. |
| Column 6, | line 4, | "device" should read --devise--. |

Signed and Sealed this

Sixth Day of April 1982

[SEAL]

Attest:

GERALD J. MOSSINGHOFF

Attesting Officer    Commissioner of Patents and Trademarks